(12) United States Patent
Tuttle

(10) Patent No.: US 7,129,534 B2
(45) Date of Patent: Oct. 31, 2006

(54) MAGNETO-RESISTIVE MEMORY AND METHOD OF MANUFACTURING THE SAME

(75) Inventor: Mark E. Tuttle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 10/838,487

(22) Filed: May 4, 2004

(65) Prior Publication Data

US 2004/0201919 A1    Oct. 14, 2004

Related U.S. Application Data

(62) Division of application No. 10/214,805, filed on Aug. 7, 2002, now Pat. No. 6,770,491.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .............. 257/295; 257/108; 257/211; 257/296; 257/414; 257/421; 257/422; 257/423; 257/424; 257/425; 257/426; 257/427; 257/622; 257/659; 257/758; 257/759; 257/760; 257/761; 257/762; 257/766; 257/774

(58) Field of Classification Search .............. 257/211, 257/622, 758–760, 108, 414, 421–427, 659, 257/295–296, 761–762, 766, 774
See application file for complete search history.

(56) References Cited

U.S. PATENT DOCUMENTS

| 3,947,831 | A |  | 3/1976 | Kobayashi et al. |  |
| 5,496,759 | A |  | 3/1996 | Yue et al. |  |
| 5,547,599 | A |  | 8/1996 | Wolfrey et al. |  |
| 5,569,617 | A |  | 10/1996 | Yeh et al. |  |
| 5,587,943 | A |  | 12/1996 | Torok et al. |  |
| 5,592,024 | A | * | 1/1997 | Aoyama et al. | ............. 257/751 |
| 5,661,062 | A |  | 8/1997 | Prinz |  |
| 5,741,435 | A |  | 4/1998 | Beetz, Jr. et al. |  |
| 5,793,112 | A | * | 8/1998 | Hasegawa et al. | ........... 257/758 |
| 5,902,690 | A |  | 5/1999 | Tracy et al. |  |
| 5,940,319 | A |  | 8/1999 | Durlam et al. | ............. 365/171 |
| 5,956,267 | A |  | 9/1999 | Hurst et al. |  |
| 6,211,090 | B1 |  | 4/2001 | Durlam et al. | ............. 438/692 |

(Continued)

*Primary Examiner*—Ida M. Soward
(74) *Attorney, Agent, or Firm*—Knobbe Martens Olson & Bear LLP

(57) ABSTRACT

A method of forming a magneto-resistive memory element includes forming a groove in a layer of insulating material. A liner is formed conformably within the groove and the groove is filled with copper and then planarized. The electrically conductive material is provided an upper surface that is recessed relative to the upper surface of the layer of insulating material. A cap, which can be conductive (e.g., Ta) or resistive (e.g., TiAlN), is disposed over the electrically conductive material and within the groove. A surface of the cap that faces away from the electrically conductive material, is formed with an elevation substantially equal to that of the edge of the liner, or the cap can extend over the liner edge. At least one layer of magneto-resistive material is disposed over a portion of the cap. Advantageously, the cap can protect the copper line from harmful etch processes required for etching a MRAM stack, while keeping the structure planar after CMP.

37 Claims, 15 Drawing Sheets

U.S. PATENT DOCUMENTS

| | | |
|---|---|---|
| 6,413,788 B1 * | 7/2002 | Tuttle .................... 438/3 |
| 6,417,561 B1 | 7/2002 | Tuttle |
| 6,433,429 B1 * | 8/2002 | Stamper .................... 257/751 |
| 6,440,753 B1 | 8/2002 | Ning et al. |
| 6,455,424 B1 | 9/2002 | McTeer et al. |
| 6,475,812 B1 | 11/2002 | Nickel et al. |
| 6,487,110 B1 | 11/2002 | Nishimura et al. ......... 365/171 |
| 6,501,144 B1 * | 12/2002 | Rizzo .................... 257/421 |
| 6,510,078 B1 | 1/2003 | Schwarzl |
| 6,518,648 B1 * | 2/2003 | Lopatin .................... 257/663 |
| 6,525,428 B1 * | 2/2003 | Ngo et al. .................... 257/774 |
| 6,548,849 B1 | 4/2003 | Pan et al. |
| 6,555,858 B1 * | 4/2003 | Jones et al. .................... 257/295 |
| 6,556,473 B1 | 4/2003 | Saito et al. |
| 6,562,634 B1 * | 5/2003 | Bronner et al. ............ 438/3 |
| 6,573,607 B1 * | 6/2003 | Ito et al. .................... 257/762 |
| 6,580,636 B1 | 6/2003 | Thewes et al. |
| 6,605,874 B1 * | 8/2003 | Leu et al. .................... 257/758 |
| 6,627,913 B1 | 9/2003 | Chen |
| 6,630,718 B1 | 10/2003 | Trivedi |
| 6,661,688 B1 | 12/2003 | Bloomquist et al. |
| 6,689,622 B1 * | 2/2004 | Drewes .................... 438/3 |
| 6,709,874 B1 * | 3/2004 | Ning .................... 438/3 |
| 6,720,245 B1 * | 4/2004 | Stucchi et al. ............ 438/614 |
| 6,783,995 B1 | 8/2004 | Hineman et al. |
| 6,794,705 B1 * | 9/2004 | Lian et al. .................... 257/310 |
| 6,806,523 B1 * | 10/2004 | Mattson .................... 257/295 |
| 6,856,025 B1 * | 2/2005 | Pogge et al. ................ 257/774 |
| 6,872,993 B1 | 3/2005 | Zhu et al. |
| 6,921,953 B1 * | 7/2005 | Deak .................... 257/421 |
| 2002/0019123 A1 * | 2/2002 | Ma et al. .................... 438/622 |
| 2002/0074575 A1 * | 6/2002 | Bangert .................... 257/211 |
| 2002/0171147 A1 * | 11/2002 | Yew et al. .................... 257/751 |
| 2002/0186583 A1 * | 12/2002 | Tuttle .................... 365/171 |
| 2003/0015770 A1 * | 1/2003 | Talin et al. .................... 257/622 |
| 2003/0071355 A1 * | 4/2003 | Dubin et al. ................ 257/751 |
| 2003/0179601 A1 | 9/2003 | Seyyedy et al. ........... 365/158 |
| 2004/0032010 A1 | 2/2004 | Kools et al. |
| 2004/0057295 A1 | 3/2004 | Matsukawa et al. |

* cited by examiner

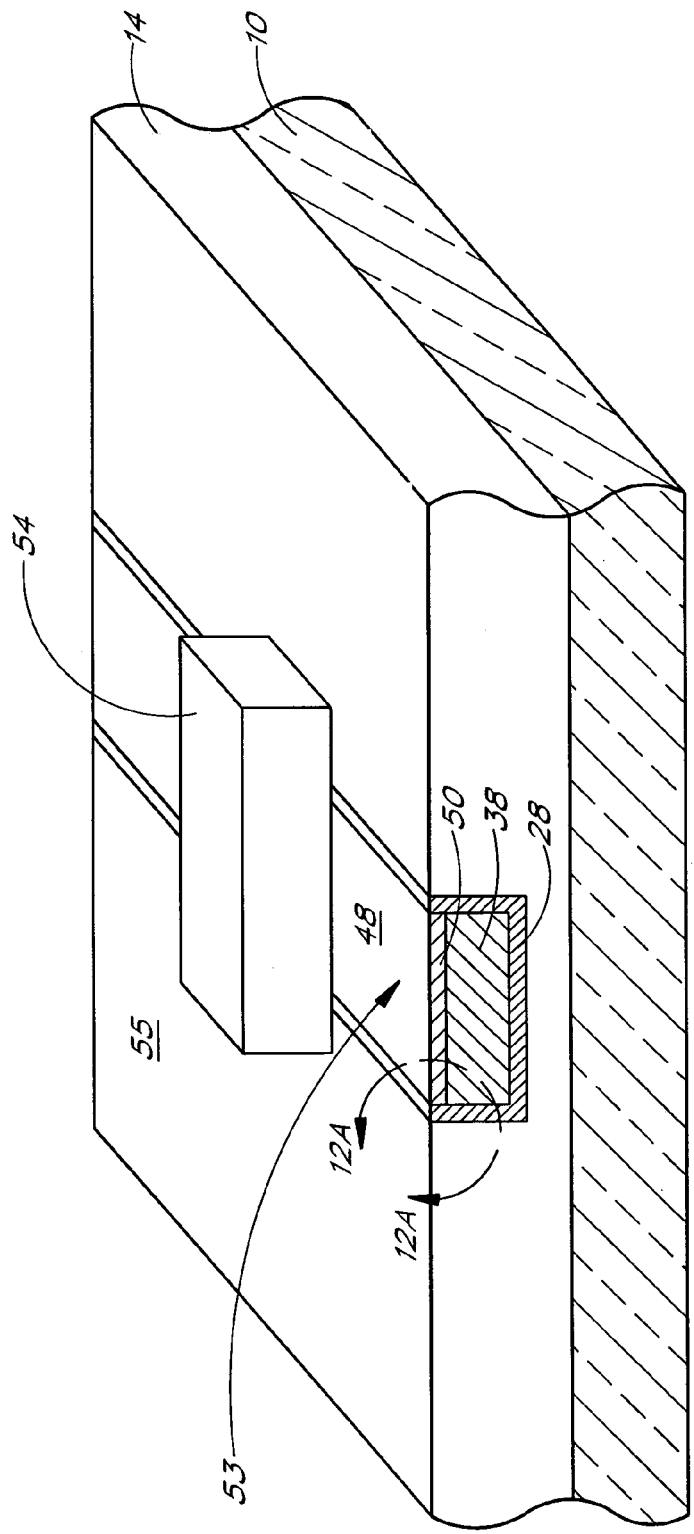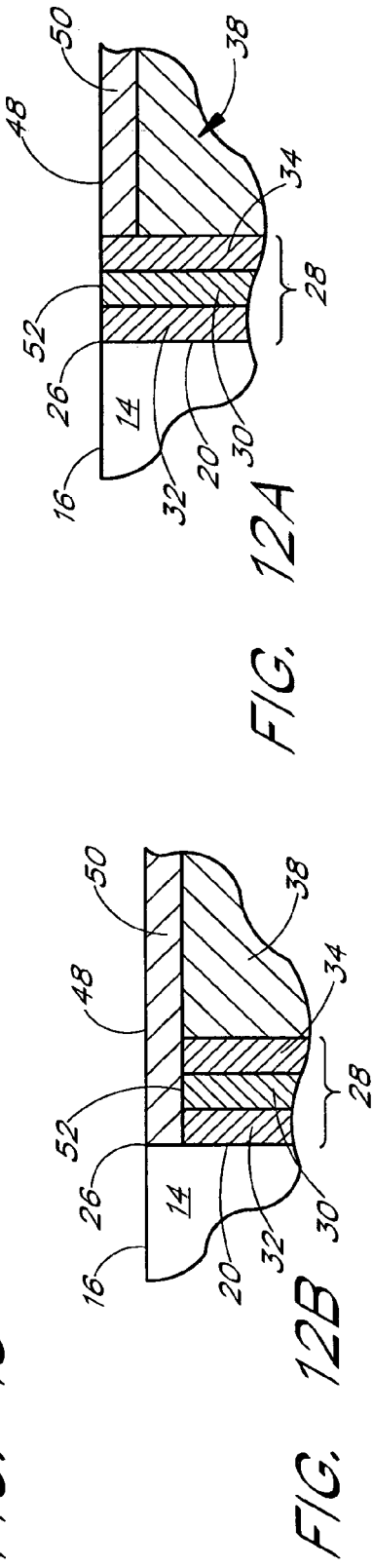
FIG. 12A
FIG. 12B
FIG. 13

US 7,129,534 B2

MAGNETO-RESISTIVE MEMORY AND METHOD OF MANUFACTURING THE SAME

RELATED APPLICATIONS

This application is a divisional application of U.S. application Ser. No. 10/214,805, entitled "MAGNETORESISTIVE MEMORY AND METHOD OF MANUFACTURING THE SAME," filed Aug. 7, 2002 now U.S. Pat. No. 6,770,491, the entirety of which is incorporated by reference herein.

This application is also related to copending U.S. application Ser. No. 10/231,803 entitled "COMBINATION ETCH STOP AND IN SITU RESISTOR IN A MAGNETORESISTIVE MEMORY AND METHODS FOR FABRICATING SAME," filed Aug. 29, 2002.

FIELD OF THE INVENTION

The present invention relates to structures and methods for forming magnetic memory elements. More particularly, the present invention relates to structures and methods for forming an electrode for a magnetoresistive memory element of a magnetic random access memory (MRAM).

BACKGROUND OF THE INVENTION

An exemplary known magnetoresistive memory element, (hereinafter "magnetic memory cell") of a known magnetic random access memory comprises, in general, a couple of ferromagnetic layers separated by a non-magnetic layer. One of the ferromagnetic layers has a high coercivity, and is provided a fixed or "pinned" magnetic vector. The other ferromagnetic layer has a lower coercivity, wherein the orientation of its magnetic vector can be "varied" by a field not large enough to re-orient the pinned layer. The layer of non-magnetic material of a tunneling magnetoresistance (TMR) device typically comprises a thin layer of insulating material which is made thin enough to permit electron tunneling—i.e., quantum mechanical tunneling of electrons from one of the ferromagnetic layers to the other. The passage of electrons through the stack of layered materials depends upon the orientation of the magnetic vector of the soft magnetic or variable layer relative to that of the pinned layer; electrons pass more freely when the magnetic vectors of the variable and pinned layers are aligned.

In an exemplary, known method of manufacturing a magnetoresistive memory cell, multiple layers of magnetic and non-magnetic materials are deposited and patterned over an electrically conductive wire, wherein a region of the electrically conductive wire serves as an electrode for the magnetic memory cell. In one arrangement, the layers of the magnetic cell are deposited as blanket layers over parallel wires and then etched into separate stacks. Each wire extends under several such stacks. Upper electrodes are formed by creating parallel conductive wires generally running perpendicular to the lower wires. Where the magnetic stacks extend between the lower conductive wires and the upper conductive wires at their intersections, the array is known as a "cross-point" cell configuration. One preferred exemplary material for the electrode of electrically conductive wire is copper. However, it has been found that chlorine-based etchants (e.g., as may be used for removing magnetic material from over select regions of the electrically conductive wire) can adversely effect the copper electrode. Accordingly, there is a need to protect copper of the electrically conductive wire from chemistries of processes that may be used during patterning of the magnetic material associated with the fabrication of a magnetic memory cell.

When a damascene scheme is employed to define the lower lines, grooves are formed within a layer of insulating material in the desired pattern of the lower wires. It is advantageous to employ copper for the wire/electrodes, due to its high conductivity, but copper has the disadvantage of quickly diffusing through typical oxide-based insulators. Accordingly, a barrier layer, e.g. a layer of tantalum, is formed as a liner conformably over the bottom and sidewalls of the groove. The barrier layer can also comprise multi-layered structures such as two layers of tantalum sandwiching a layer of nickel-iron to additionally perform a magnetic "keeper" function. A highly conductive material, preferably copper as noted, is then formed within the groove to define, at least in part, an electrode for the magnetic memory cell.

In a particular, exemplary, known damascene process for the formation of the electrically conductive wire, copper is formed in a groove lined with barrier material, as described above. A planarization process provides an etch-back of the copper until exposing material of the insulating layer. However, it has been found that different resistance of the barrier layer to the planarization process, as compared to copper's resistance, can result in an uneven topography. For example, a portion of the barrier layer can protrude above the exposed surface of the planarized copper and above the exposed surface of the insulating layer. Conversely, depending upon etch chemistry and materials, the barrier layer can be recessed relative to the upper surface of the structure.

When a layer of ferromagnetic material is deposited over such an uneven surface—e.g., with the protruding ears—the uneven surface may degrade or alter properties of the magnetic layer. Therefore, when forming layers of magnetic material over a surface to fabricate a magnetic memory, it is desirable that the surface comprises a smooth, flat or planar topography in order to preserve the integrity of the magnetic material. Accordingly, there is a need to provide a structure for, and process of fabricating, an electrode structure exhibiting a flat topography for a magnetic memory cell.

SUMMARY OF THE INVENTION

In accordance with an embodiment of the present invention, an electrode structure for a magnetic memory device comprises a layer of insulating material with a groove defined therein. Sidewalls of the groove meet a surface of the layer of insulating material to define an edge or lip. A liner is disposed conformably over the insulating material and within the groove. An electrically conductive wire is disposed within the groove, with a cap layer formed thereover. The cap layer comprises electrically conductive material different from that of the electrically conductive wire. Magnetic material is disposed over at least a portion of the electrically conductive wire.

In accordance with further aspects of this exemplary embodiment of the present invention, the cap comprises tantalum and the electrically conductive wire comprises copper. Additionally, the liner may comprise a multi-layered structure, such as a stack of a barrier or adhesion metal layer, a magnetic material layer and an optional additional barrier or adhesion layer.

In accordance with another embodiment of the present invention, a magneto-resistive memory element comprises a substrate having a layer of insulating material thereover. A groove that is defined within the insulating material has a liner disposed comformably therein. Electrically conductive material is disposed within the groove and over the liner. A protective layer is disposed over the electrically conductive material and within the groove, and comprises an outer surface that faces away from the electrically conductive material with an elevation substantially equal to that of the distal surface of the layer of insulating material. At least one layer of magneto-resistive material is disposed over a portion of the protective layer.

In accordance with a further aspect of these exemplary embodiments, the protective layer comprises tantalum and the electrically conductive material comprises copper. Additionally, the liner may comprise first and second layers of electrically conductive material that sandwich a layer of ferromagnetic material therebetween.

In accordance with a further exemplary embodiment of the present invention, a magneto-resistive random access memory device comprises a substrate and a layer of insulating material disposed over the substrate. Walls of the layer of insulating material define a groove within which first electrically conductive material is disposed as an electrically conductive wire. In addition, a liner is disposed conformably within the groove for isolating the first electrically conductive material from the insulating walls of the groove. A protective layer, comprising electrically conductive material different from the first electrically conductive material, is disposed within the groove and over the first electrically conductive material. The protective layer has a first surface that is in contact with the first electrically conductive material, and a second surface opposite the first. The second surface is level with that of a plane defined by a surface of the layer of insulating material. At least one layer of magneto-resistive material is disposed over at least a portion of the protective layer.

In accordance with a particular aspect of this embodiment, the first electrically conductive material comprises copper and the liner comprises a layered structure selected from the group comprising tantalum, tantalum/nickel-iron, and tantalum/nickel-iron/tantalum.

In accordance with another embodiment of the present invention, a method of fabricating a magnetic memory device comprises forming a layer of insulating material over a substrate. A groove is provided within the layer of insulating material. A barrier layer is formed conformably over and within the groove and in contact with the layer of insulating material. An electrically conductive material is formed over the barrier layer and then planarized. After planarization, a protective layer is formed over the electrically conductive material within the groove. The protective layer is then planarized for a duration sufficient to expose a surface of the layer of insulating material and form a surface of the protective layer substantially level with the exposed surface of the layer of insulating material. Next, at least one layer of magnetic material is formed and patterned over the protective layer.

In accordance with a further aspect of this exemplary embodiment of the present invention, before the protective layer is provided, a portion of the electrically conductive material is removed from within the groove for defining a recessed surface thereof relative to the upper surface of the insulating material. In accordance with one aspect of this exemplary embodiment, the recessed surface of the electrically conductive material is formed by etching. Preferably, the recessed surface is formed with a depth of about 10 Å to 1,000 Å relative to the upper surface of the layer of insulating material.

In accordance with another embodiment of the invention, the protective material capping the lower conducting line (below a magnetic memory stack) comprises a relatively resistive material, such as TaN, TiAlN, WSiN, TaSiN, etc. Accordingly, a resistor is formed in series with the electrode under each magnetic stack. A high series resistance thus aids in preventing shorting in a cross-point cell arrangement.

These and other features of the present invention will become more fully apparent in the following description and independent claims, or may be learned by practice of the invention as set forth herein.

BRIEF DESCRIPTION OF THE DRAWINGS

The present invention will be understood from reading descriptions of the particular embodiments with reference to examples illustrated in the appended drawings. Understanding that these drawings depict only exemplary embodiments of the invention and are not therefore to be considered limiting of its scope, the invention will be described and explained with additional detail through use of the accompanying drawings in which:

FIGS. 12A and 12B are partial, exploded cross-sectional views schematically illustrating a portion of an electrode structure for a magneto-resistive memory element in accordance with exemplary embodiments of the present invention;

FIG. 13 is a partial perspective view schematically illustrating a stack of magneto-resistive material overlying an electrode of a magneto-resistive memory element in accordance with exemplary embodiments of the present invention;

DETAILED DESCRIPTION OF THE PREFERRED EMBODIMENT

The present invention relates to structures and methods for forming magneto-resistive memory and associated electrode structures.

Referencing FIGS. 1–12, an exemplary embodiment of a method of forming a magneto-resistive memory element of, for example, a magneto-resistive random access memory (MRAM), is shown with particular attention to its lower electrode.

As used herein, the term "substrate" or "semiconductor substrate" shall encompass structures comprising semiconductor material, including, but not limited to, bulk semiconductor materials such as a semiconductor wafer (either alone or in assemblies comprising other materials thereon), and semiconductive material layers (either alone or in assemblies comprising other materials). Further, the term "substrate" shall also encompass any supporting structures, including, but not limited to, the semiconductive substrates described above. Furthermore, when reference is made to substrate within the following description, previous process steps may have been utilized to form regions, structures or junctions in or on its base semiconductor structure or foundation.

Figure 1:
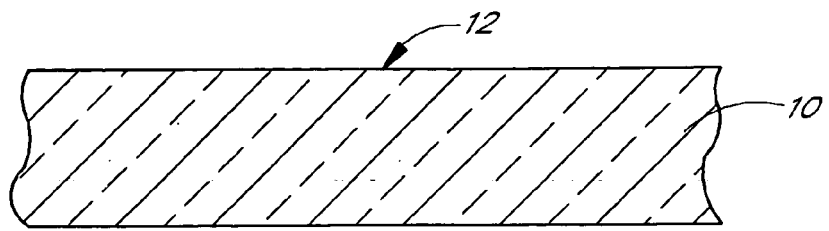
FIG. 1 is a simplified cross-sectional view of a substrate over which a magneto-resistive memory element is to be constructed in accordance with exemplary embodiments of the present invention.

Continuing with reference to FIG. 1, substrate 10 comprises a surface 12 upon which a magnetic memory element will be fabricated in accordance with a method of the present invention. As referenced above, substrate 10 may comprise, for example, layers and structures (not shown) which are known in the art for the formation of electrical circuitry.

Figure 2:
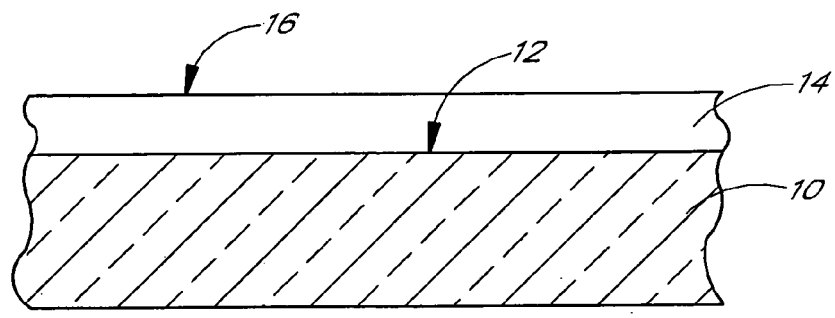
FIG. 2 is a partial cross-sectional view schematically illustrating an intermediate procedure of the present invention associated with the formation of a magneto-resistive memory element, wherein a layer of insulating material is deposited over a substrate.

Moving forward with reference to FIG. 2, a layer of insulating material 14 is formed over substrate 10. As illustrated in FIG. 2, insulating material 14 is shown over a flat surface 12 of substrate 10. However, it will be understood that the scope of the present invention encompasses substrates of non-flat surfaces or structures over which insulating material 14 may be deposited.

In an exemplary embodiment of the present invention, the layer of insulating material 14 is deposited with a thickness of about 500 Å to about 10,000 Å, and is deposited by a known method of deposition such as sputtering, chemical vapor deposition, plasma enhanced CVD, physical vapor deposition, and/or other known method of depositing insulating material. In a preferred exemplary embodiment, the insulating material is formed by, for example, CVD oxide or silicon nitride, low or high pressure TEOS procedures, or other doped or undoped glass deposition methods. In accordance with further alternative exemplary embodiments, insulating material 14 may comprise high temperature tolerant polymers such as a polyamide.

After depositing the layer of insulating material 14, the layer is planarized to provide a flat and planar surface 16. The upper surface 16 is planarized by known planarization procedures, such as, for example, plasma or chemical-mechanical planarization.

Figure 3:
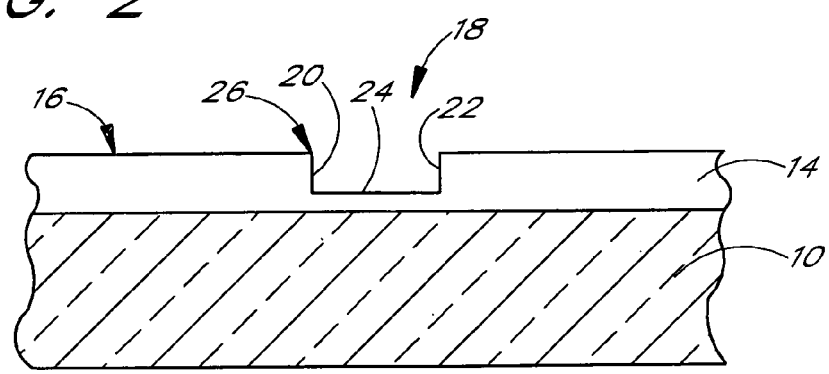
FIG. 3 is a partial cross-sectional view schematically illustrating a further intermediate step of the present invention associated with the formation of a magneto-resistive memory, wherein a groove is formed within a layer of insulating material.

Next, with reference to FIG. 3, a groove 18 is formed within the layer of insulating material 14, which groove is defined by walls 20, 22, 24. The groove 18 is formed using known photolithographic, masking and etching procedures. For example, photoresist may be layered over the insulating layer 14 and patterned to define an opening through which to etch insulating material. A wet or dry etching process is used to remove regions of the layer of insulating material 14, which regions are exposed by the opening of photoresist. In a particular embodiment of the present invention, the groove 18 is formed with a depth in the range of about 500 Å to about 5,000 Å, and more preferably a depth of about 2,000 Å. Preferably, the depth of the groove 18 is less than the thickness of the layer of insulating material 14. Sidewalls 20 and 22 meet the surface 16 of the layer of insulating material 14 to define a lip or edge 26.

Figure 4:
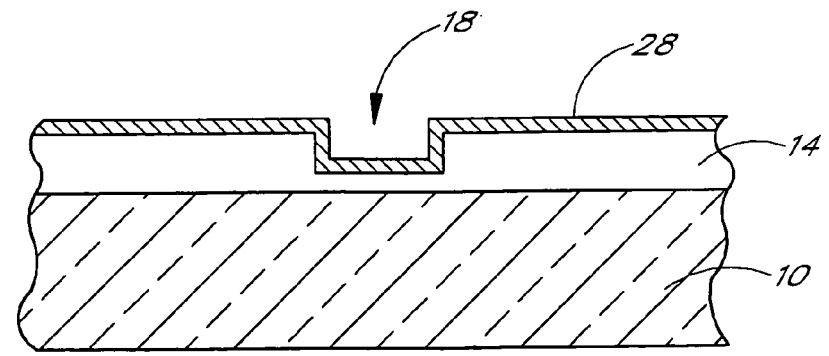
FIG. 4 is a partial cross-sectional view schematically illustrating an intermediate step of the present invention, associated with the formation of a magneto-resistive memory, wherein a liner is formed conformably over insulating material and within a groove.

After forming the groove 18, a liner 28 is formed conformably over the insulating material 14 and within the groove 18 as illustrated in FIG. 4. In accordance with one embodiment of the present invention, the liner 28 comprises a barrier material such as, e.g., tantalum, titanium, tungsten, titanium tungsten, titanium nitride or chromium, and is selected to provide strong mechanical bonding between the electrically conductive wire of the electrode to be formed and the material of the insulating layer 14. Additionally, the liner composition is selected to prevent migration of elements from the insulating material to the electrically conductive wire and vice versa. In accordance with a preferred exemplary embodiment of the present invention, the barrier layer is formed by sputtering of tantalum and is deposited with a thickness of about 5 nanometers to 10 nanometers.

Figure 5:
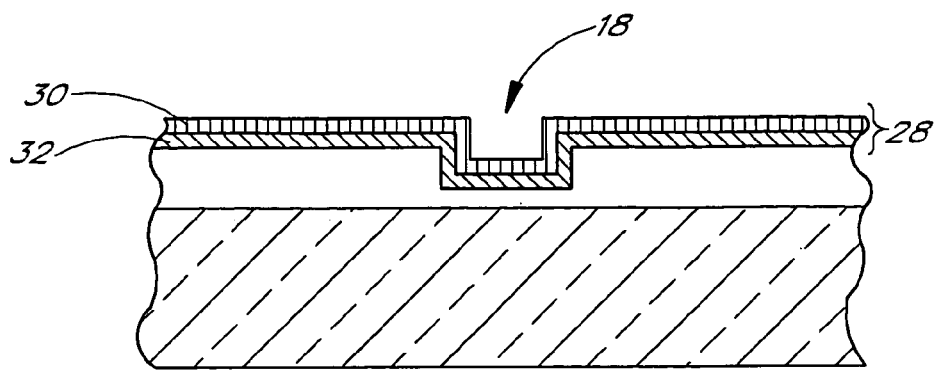
FIG. 5 is a partial cross-sectional view schematically illustrating formation of a barrier layer over an insulating layer and within a groove, in accordance with an exemplary method of the present invention for the formation of a magneto-resistive memory, wherein a layer of ferromagnetic material is deposited over a layer of electrically conductive material.
Figure 6:
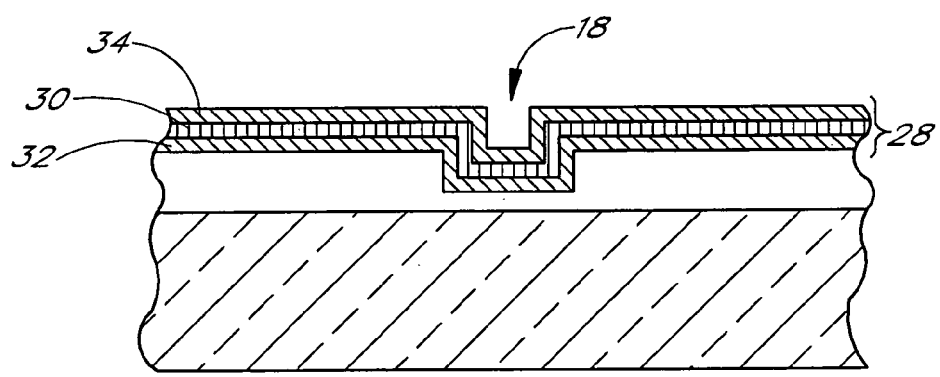
FIG. 6 is a partial cross-sectional view schematically illustrating an alternative barrier layer associated with the formation of a magneto-resistive memory element in accordance with exemplary embodiments of the present invention, wherein the barrier layer comprises two layers of electrically conductive material that sandwich a layer of ferromagnetic material therebetween.

In accordance with an optional aspect of this embodiment of the present invention, with reference to FIGS. 5 and 6, the formation of the liner 28 further comprises depositing a layer of ferromagnetic material 30 over a first barrier layer 32 of electrically conductive material. Additionally, with reference to FIG. 6, another barrier layer 34 of electrically conductive material may also be deposited over the layer of ferromagnetic material 30. For example, in accordance with a particular exemplary embodiment, the formation of the liner 28 comprises, firstly, depositing a layer of tantalum, followed by depositing a layer of nickel-iron (NiFe), and, thereafter, depositing or forming another layer of tantalum. This multi-layered structure of tantalum/nickel-iron/tantalum (Ta/NiFe/Ta) for the liner within the trough will serve, at least in part, to provide a magnetic "keeper" function by focusing or confinement of electromagnetic fields about the electrically conductive wire (as may be generated by a current flow through the electrically conductive wire). Accordingly, although the liner 28 may be shown subsequently herein as comprising simply a single layer of material, it will be understood that the scope of the present invention encompasses alternative multi-layered liner structures, e.g., such as those illustrated and described with reference to FIGS. 5 and 6.

Figure 7:
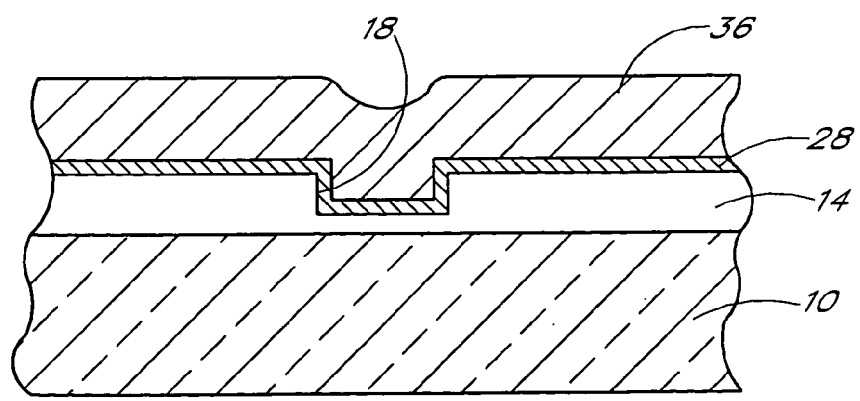
FIG. 7 is a partial cross-sectional view schematically illustrating an intermediate step in a formation of a magneto-resistive memory element in accordance with exemplary embodiments of the present invention, wherein electrically conductive material is formed within a groove.

Moving forward with a description of an exemplary embodiment of the present invention, with further reference to FIG. 7, a conductive material 36 is formed over liner 28 and provided a thickness sufficient for filling the groove 18. In a preferred exemplary embodiment of the present invention, the conductive material 36 comprises copper. In accordance with alternative exemplary embodiments, the conductive material 36 comprises other electrically conductive materials, such as, e.g., doped polysilicon, aluminum, tungsten, gold, metal alloy, conductive oxides, and the like.

Figure 8A:
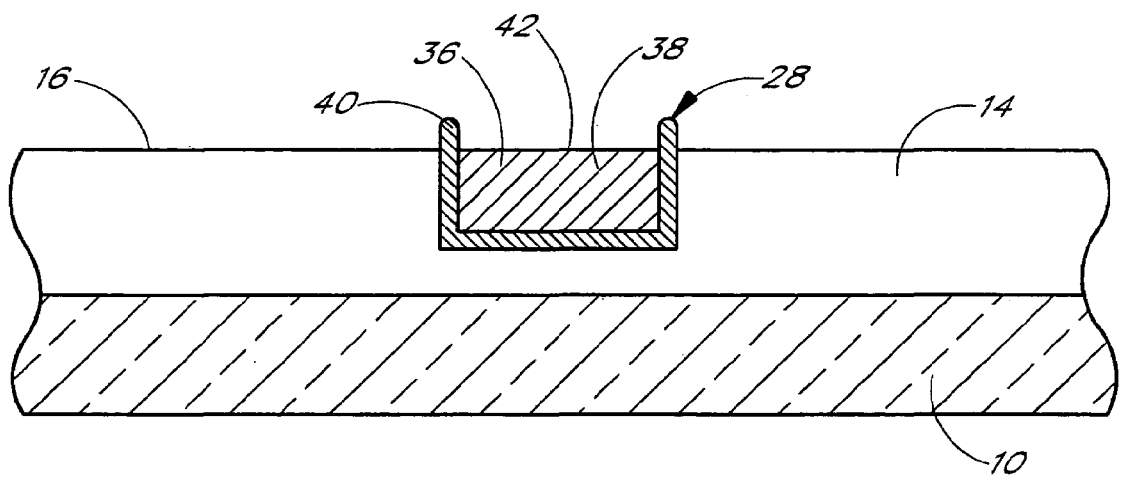
FIGS. 8A and 8B are partial cross-sectional views schematically illustrating an intermediate step in a formation of a magneto-resistive memory element in accordance with exemplary embodiments of the present invention, wherein electrically conductive material is planarized during the formation of an electrically conductive wire within a groove.
Figure 8B:
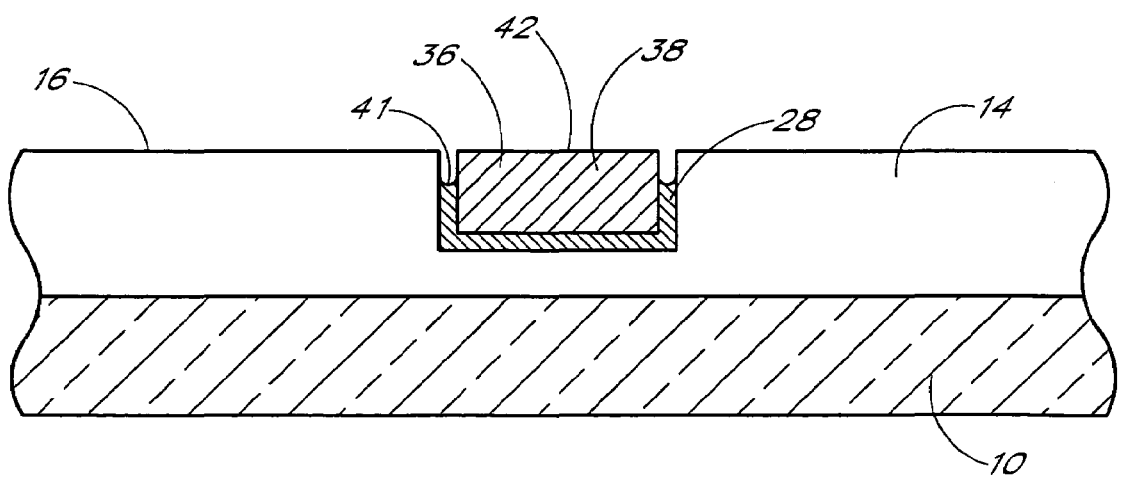

Next, with reference to FIGS. 8A and 8B the conductive material 36 of FIG. 7 is planarized to leave an electrically conductive wire 38 within the groove 18. In accordance with preferred exemplary embodiments of the present invention, the conductive material is planarized by known abrasive polishing (such as chemical-mechanical polishing) or dry plasma etching planarization methods. The inventor has recognized a potential problem stemming from the planarization of the electrically conductive material, namely that a portion of the liner layer(s) 28 may be left protruding, as ears 40 (FIG. 8A), above both upper surface 16 of the layer of insulating material 14 and the upper surface 42 of the conductive wire 38. Depending upon the materials used, the liner layer(s) 28 can instead form recesses 41 (FIG. 8B) relative to the conductive wire 38 and insulating material 14. Either the ears 40 or recesses 41 can adversely affect the integrity of magneto-resistive materials layered that might be layered thereover. Such protrusions or recessions can result from a difference in planarization etch rate of the liner material relative to an insulating material 14.

Figure 9A:
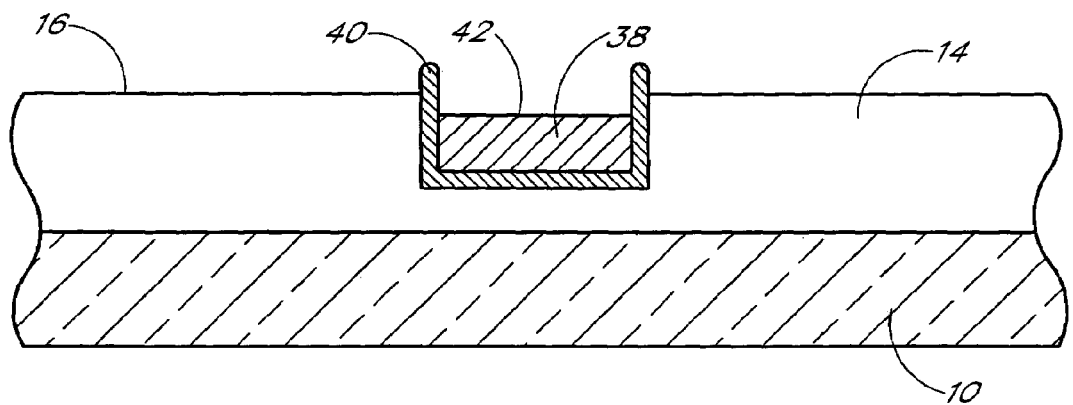
FIGS. 9A and 9B are partial cross-sectional views schematically illustrating another portion of a procedure for the formation of a magneto-resistive memory element in accordance with exemplary embodiments of the present invention, wherein an upper surface of an electrically conductive wire is recessed within the groove.
Figure 9B:
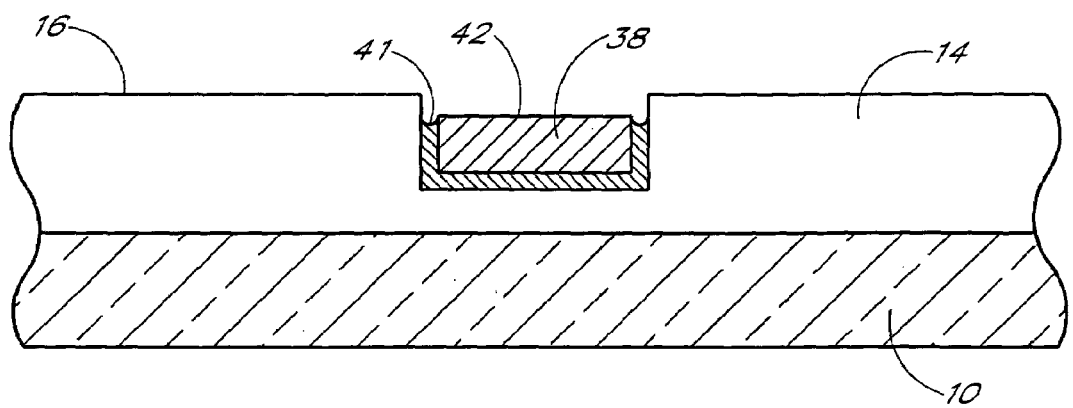

Continuing with reference to FIGS. 9A and 9B, additional etching of the electrically conductive wire 38 forms a surface 42 of the electrically conductive wire to be recessed relative to the upper surface 16 of the layer of insulating material 14. In one particular exemplary embodiment, the electrically conductive material comprises copper and the recessed surface 42 of the electrically conductive wire 38 is formed by subjecting the copper of the electrically conductive wire to a wet chemical etchant of ammonium hydroxide. Alternatively, the copper material is exposed to a known ion beam milling comprising argon. In a further alternative embodiment of the present invention, the recessed surface 42 is formed as a part of, and within, the planarization process for planarizing the electrically conductive material 32, wherein the planarization etch rate of the electrically conductive material 38 is greater than that of the layer of insulating material 14. Preferably, the recessed surface 42 of the electrically conductive material 36 is formed with a depth of about 50 521 to 500 Å, and more preferably about 300 Å, relative to the upper surface 16 of the layer of insulating material 14. Where the liner 28 has previously been recessed (FIG. 9B), the surface 42 is preferably recessed to about the same level as the liner 28, as shown in FIG. 9B.

Figure 10A:
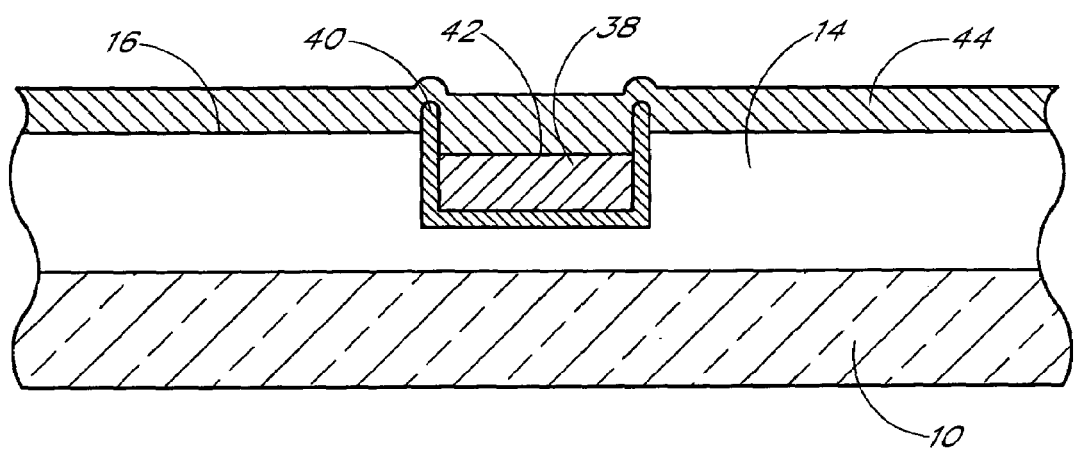
FIGS. 10A and 10B are partial cross-sectional views schematically illustrating an intermediate step in a method of forming a magneto-resistive memory element in accordance with exemplary embodiments of the present invention, wherein a layer of electrically conductive material is formed over an electrically conductive wire that is recessed within a groove.
Figure 10B:
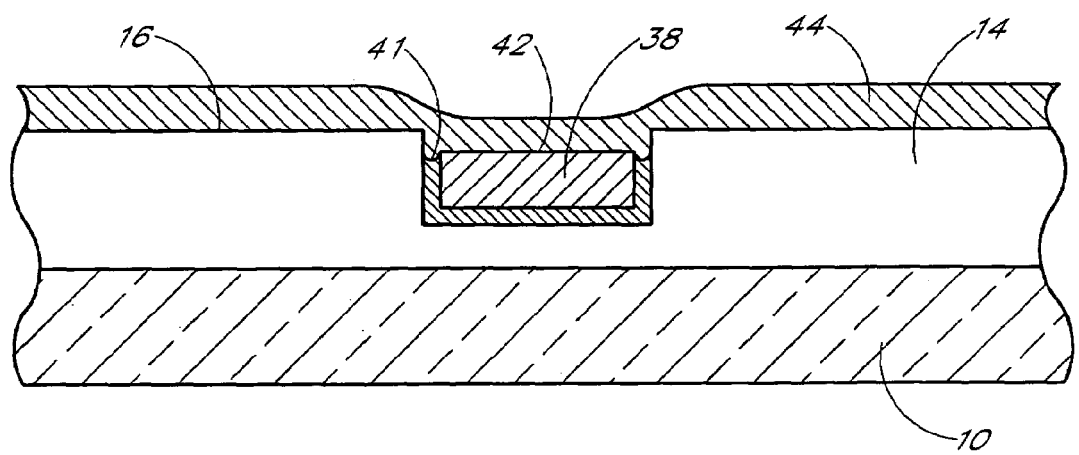

Referring to FIGS. 10A and 10B, after forming the recessed surface 42, further material is deposited as a cap layer 44 over the conductive wire 38, including over the ears 40 (FIG. 10A) or recesses 41 (FIG. 10B) and the upper surface 16 of the layer of the insulating material 14. The cap layer 44 is provided a thickness greater than the depth of the recessed surface within the groove 18. In accordance with a particular exemplary embodiment, the cap layer 44 comprises tantalum and is formed with a thickness of about 500 Å to 1,000 Å. In the illustrated embodiment, the cap layer 44 is selected to be electrically conductive, non-magnetic, and capable of serving as an etch-stop when magnetic materials are etched thereover. Preferably, the cap layer 44 is also selected with qualities providing a planarization etch rate similar to that of the layer of insulating material 14 so as to facilitate planarization of the cap layer 44, as will be described more fully herein below.

In another arrangement, the cap layer 44 comprises a relatively resistive material, such as TaN, TiAlN, WSiN, TaSiN, etc. In accordance with this arrangement, the cap layer 44 will serve as an integrated or in situ series resistor below each magnetic memory device.

Figure 11A:
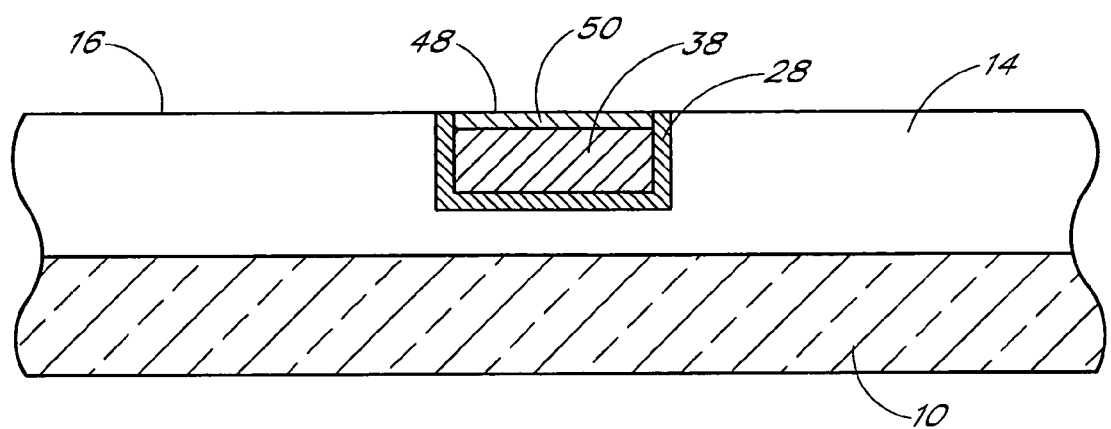
FIGS. 11A and 11B are partial cross-sectional views schematically illustrating another intermediate procedure of the process of fabricating a magneto-resistive memory element in accordance with exemplary embodiments of the present invention, wherein electrically conductive material is planarized to form a protective cap over the electrically conductive wire within the groove.
Figure 11B:
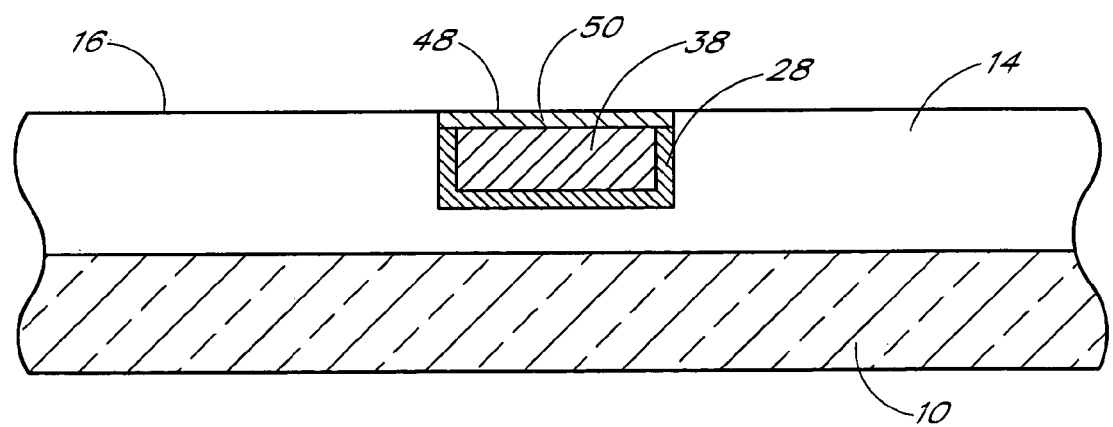

Next, the cap layer 44 is planarized using a known abrasive (e.g., chemical-mechanical) planarization procedures, and a surface 48 of a resulting cap 50, with reference to FIGS. 11A and 11B, is formed with a level equal to that of the upper surface 16 of the layer of insulating material 14. It will be understood that the upper surface 16 may be slightly modified by the preceding planarization, since it will typically not stop precisely upon the insulator.

Furthermore, as shown in the exploded view of FIG. 12A, the upper surface 48 of the cap 50 is formed with a level equal to that of an end wall 52 of the liner 28. To facilitate formation of this structure, the planarization of the cap layer 44 (FIG. 10) is terminated shortly after exposure of the upper surface 16 of the layer of insulating material 14. Again, the material of the cap 50 is preferably selected to have a planarization etch rate similar to that of the material of the liner 28. For example, when the electrically conductive material of the liner 28 comprises tantalum, tantalum can be selected for the material of cap 50. It will be understood that the upper surface 16 may be slightly modified by the preceding planarization, since it will typically not stop precisely upon the insulator. In accordance with a preferred embodiment of the present invention, the cap layer 44 (FIGS. 10A and 10B) is planarized by a commercially available chemical-mechanical planarization Cu process from Hitachi, 3M Corp., Cabot, etc. to form the cap 50.

Alternatively, with reference to FIG. 12B, planarization leaves the resulting cap 50 extending over the recessed end wall 52. The cap surface 48 is formed with a level equal to that of the upper surface 16 of the layer of insulating material 14. It will be understood that the upper surface 16 may be slightly modified by the preceding planarization, since it will typically not stop precisely upon the insulator. In this example, the recessed liner 28 is filled over by the cap so, leaving a planar surface prior to further deposition.

Through the above steps, an electrode structure is formed with a flat level surface, upon which multiple layers of magneto-resistive material can be formed.

Figure 14:
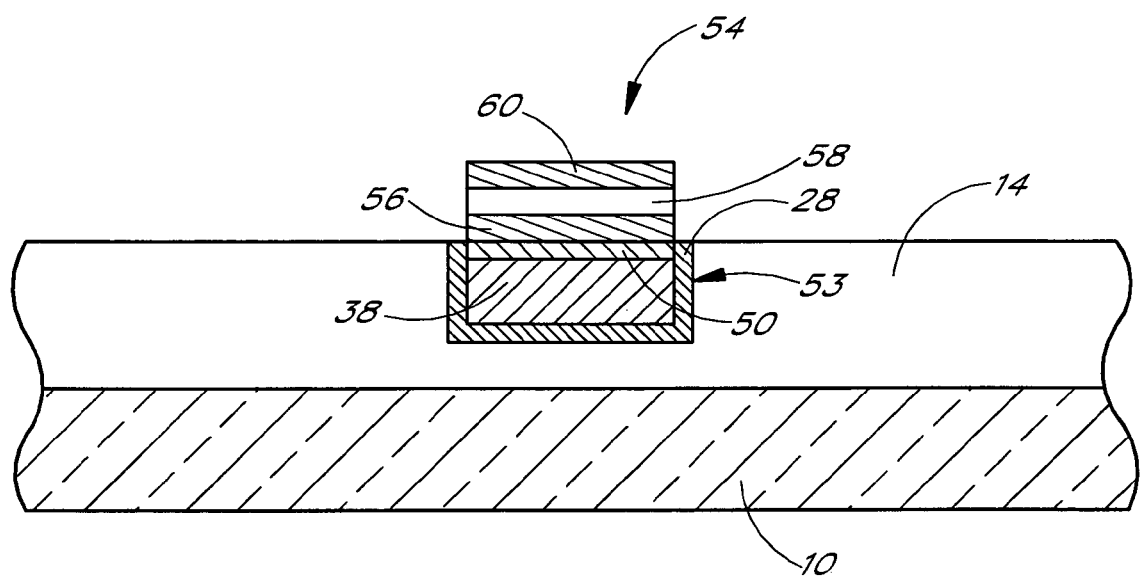
FIG. 14 is a partial cross-sectional view schematically illustrating multiple layers of a magneto-resistive stack.

Further exemplary embodiments of the present invention are now characterized below with reference to FIGS. 13–20. Though shown for the example of FIGS. 8A–12A, it will be understood that the process of FIGS. 13–20 has application to the embodiment of FIGS. 8B–12B. Multiple layers of a magneto-resistive stack 54 are formed using known methods of magneto-resistive layer fabrication. For a simplistic illustration, as shown in FIG. 14, an exemplary magneto-resistive stack 54 comprises two layers of ferromagnetic material 56, 60 that sandwich a layer 58 of non-magnetic material. The first layer of ferromagnetic material is known as a pinned layer 56. The layer of non-magnetic material serves as a tunneling layer 58, and the subsequent layer of ferromagnetic material 60 is known as a sense layer 60.

Accordingly, an exemplary magneto-resistive memory element 55 of the present invention comprises, with reference to FIGS. 13–14, a barrier or cap 50 disposed over an electrically conductive wire 38 that provides, at least in part, an electrode 53 within a groove of an insulating layer 14 over the substrate 10. The cap 50, in accordance with an exemplary aspect, serves to preserve the integrity of the electrically conductive wire 38 during processing of a stack of magneto-resistive layers 54 associated with the fabrication of the magneto-resistive memory element. In the embodiment of FIG. 12A, the cap 50 comprises material different from that of the electrically conductive wire 38 and is formed with an outer surface 48 substantially level with the end wall 52 of the liner 28 that is disposed about sidewalls of the electrically conductive wire 38. In the embodiment of FIG. 12B, the cap extends over the end wall 52 of the liner 28. The outer surface 48 of the cap 50, preferably, is also substantially level with the upper surface 16 of the layer of insulating material 14 within which the liner 28 and the electrically conductive wire 38 are formed. In one arrangement, the cap 50 is conductive; in another arrangement, the cap 50 further serves as an in situ resistor.

Figure 15:
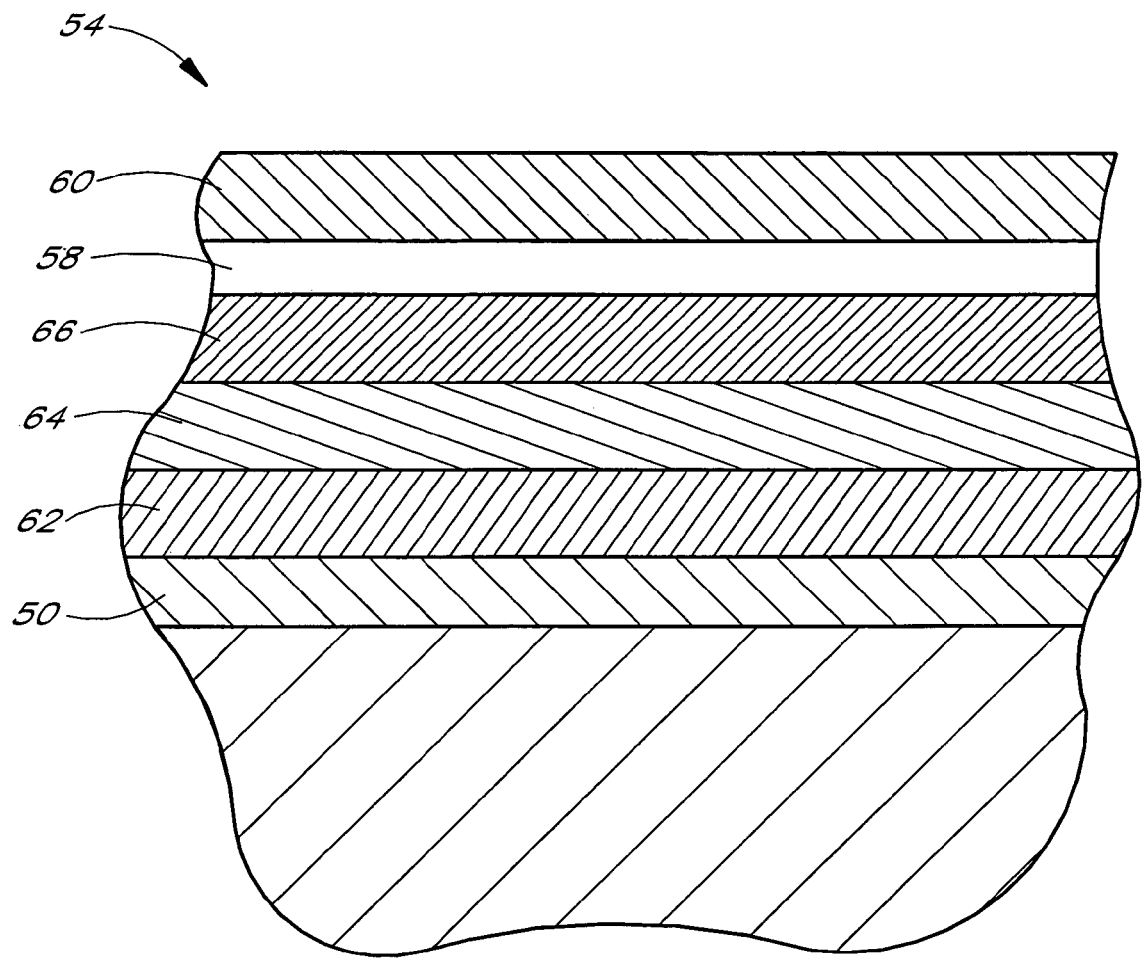
FIG. 15 is a partial, cross-sectional view schematically illustrating an alternative, multi-layered structure for a magneto-resistive stack over an electrode of a magneto-resistive memory element, in accordance with an exemplary embodiment of the present invention.
Figure 16:
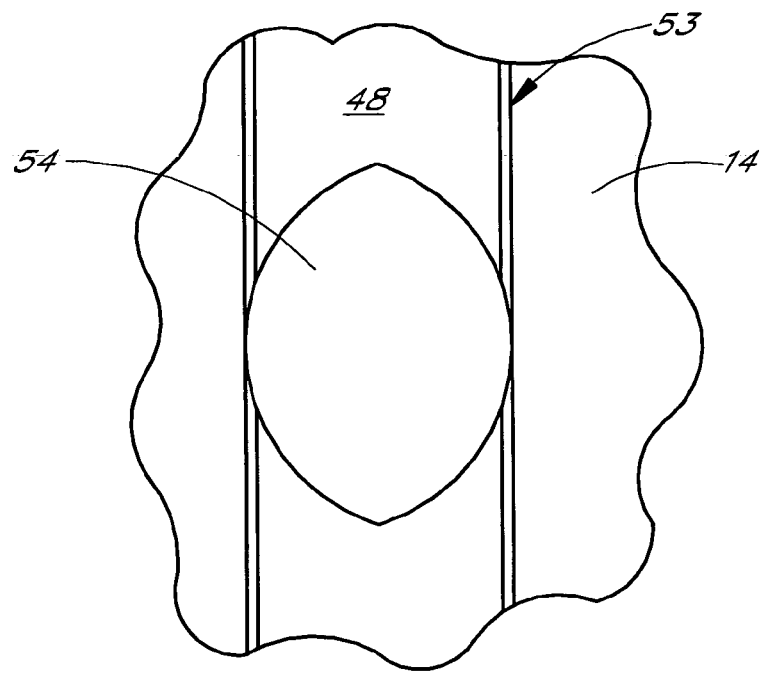
FIGS. 16 and 17 are planar views illustrating alternative exemplary shapes for exemplary magneto-resistive memory elements of the present invention.
Figure 17:
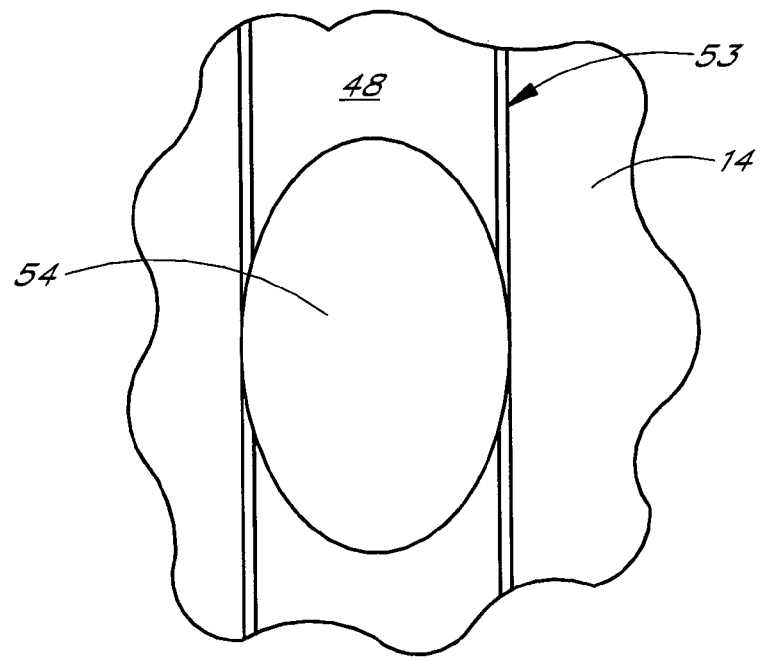

In accordance with a more detailed specific exemplary embodiment of the present invention, with reference to the partial cross-sectional view of FIG. 15, a first layer 62 of nickel-iron-cobalt (NiFeCo) is provided as a seed layer over the cap layer 50. A layer of iridium manganese (IrMn) is provided as a pinning layer 64 over the nickel-iron-cobalt seed layer 62. A pinned layer 66 of cobalt-iron (CoFe) is formed over the pinning layer 64.

Continuing with the fabrication of the magneto-resistive memory stack, further referencing FIG. 15, a non-magnetic layer 58 of, for example, aluminum oxide, is provided as a tunnel layer over pinned layer 66. The tunnel layer, for example, of aluminum oxide, is formed with a thickness of 5 Å to 40 Å. More preferably, the tunnel layer is formed with a thickness of about 15 angstroms, i.e., sufficiently thin for permitting tunneling of electrons therethrough. Finally, another layer 60 of nickel-iron-cobalt (NiFeCo) or permalloy is formed as a sense layer over the non-magnetic tunnel layer. The sense layer 60 is provided a thickness of about 10 Å to 100 Å, and more preferably, a thickness of 40 Å. These multiple layers of the magneto-resistive stack 54 are deposited using known methods of deposition, such as, e.g., CVD and/or sputtering. After forming the multiple layers of the magneto-resistive materials (62, 64, 66, 58, 60), the layers are then patterned to form a stack for a magneto-resistive memory element 54, as illustrated in FIGS. 13 and 14.

In FIG. 13, the exemplary magneto-resistive memory element 54 is shown as comprising the shape of a rectangular block. However, it is understood, that the magneto-resistive element 54 may take on alternative shapes, e.g., such as an ellipse or an elliptical eye as illustrated representatively by FIGS. 16 and 17. Therefore, although patterning of an exemplary magneto-resistive memory element 54 will be shown as forming a rectangular shape; it will be understood that the scope of the present invention encompasses patterning of the magneto-resistive memory into alternative memory element shapes. Furthermore, for purposes of simplifying the disclosure that follows, referencing FIGS. 15 and 18–23, the multiple layers of stack 54 are illustrated in a simplified three-layer form, representing the electrically functional pinned layer, tunneling dielectric and sense layer.

Figure 18:
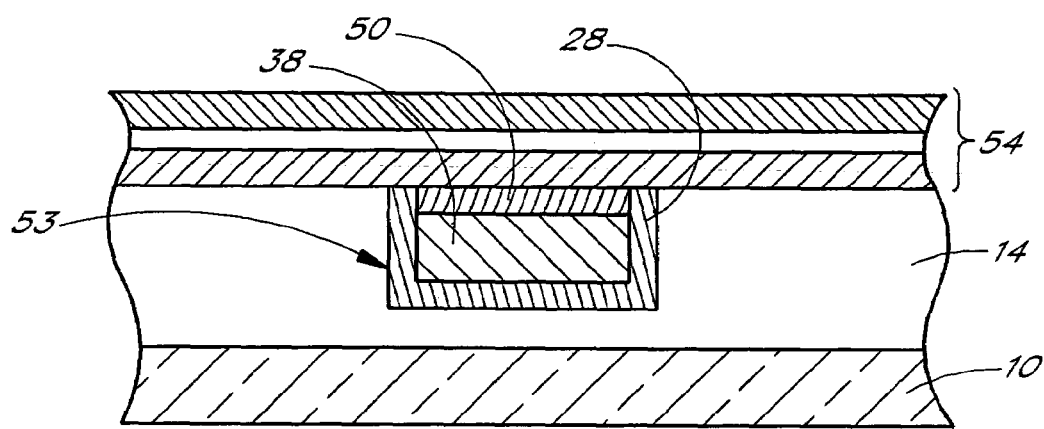
FIGS. 18–23 illustrate an exemplary sequence of photolithographic and etching steps for patterning of magneto-resistive material over an electrode for the formation of a magneto-resistive memory element in accordance with exemplary embodiments of the present invention.
Figure 19:
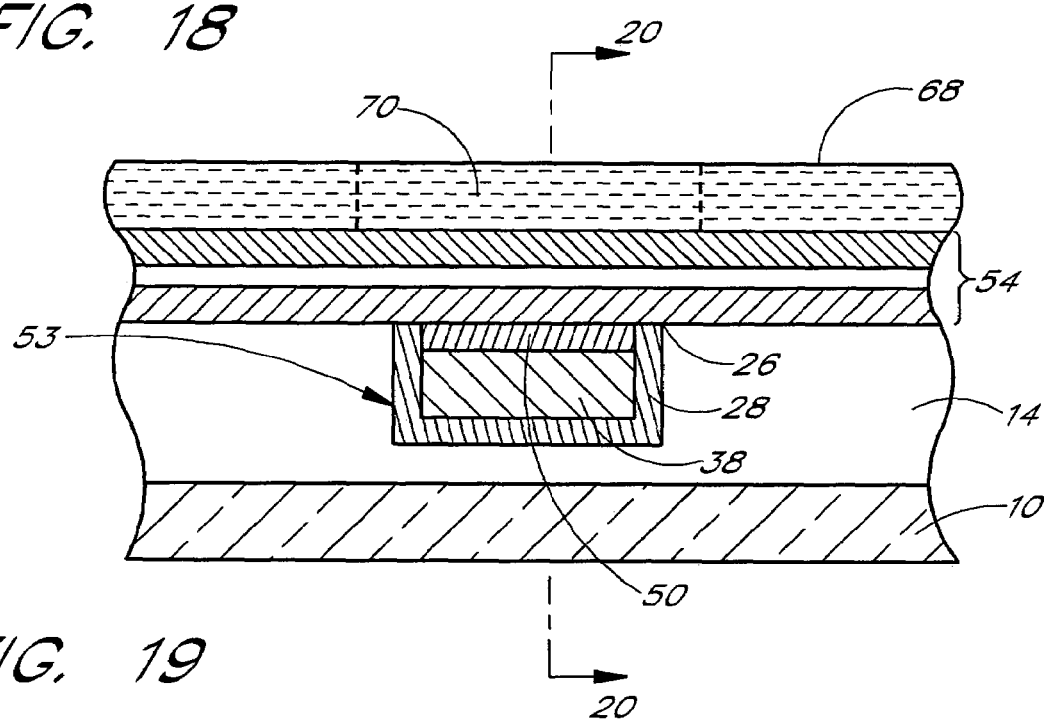
Figure 20:
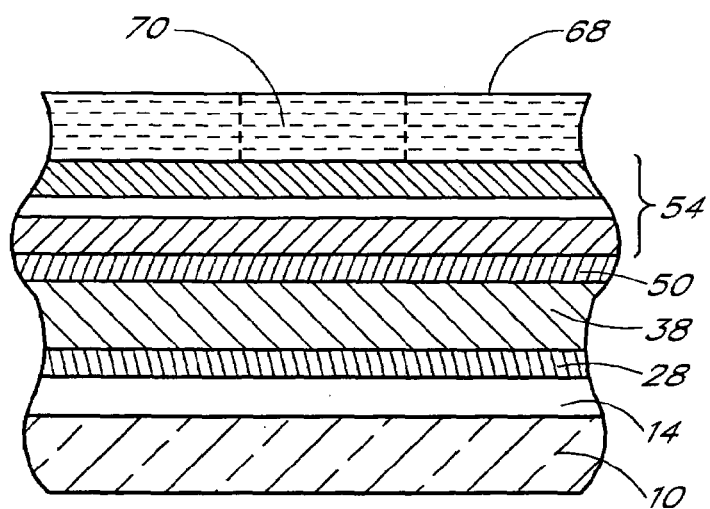

Continuing with reference to FIG. 18, magneto-resistive material 54 is formed over the insulating material 14, the electrically conductive wire 38, the liner 28 and the cap 50. Next, with reference to FIG. 19, a layer of mask material 68, such as photoresist, is formed over the magneto-resistive material 54. FIG. 20 shows a side view of the same configuration of FIG. 19, taken along lines 20—20. The layer of mask material 68 is patterned as known in the art to form a mask 70 over select regions of the magneto-resistive material 54. Again, although mask 70 is illustrated herein with a rectangular shape, it will be understood that it may take on alternative configurations, such as, e.g., elliptical or eye shapes.

Figure 21:
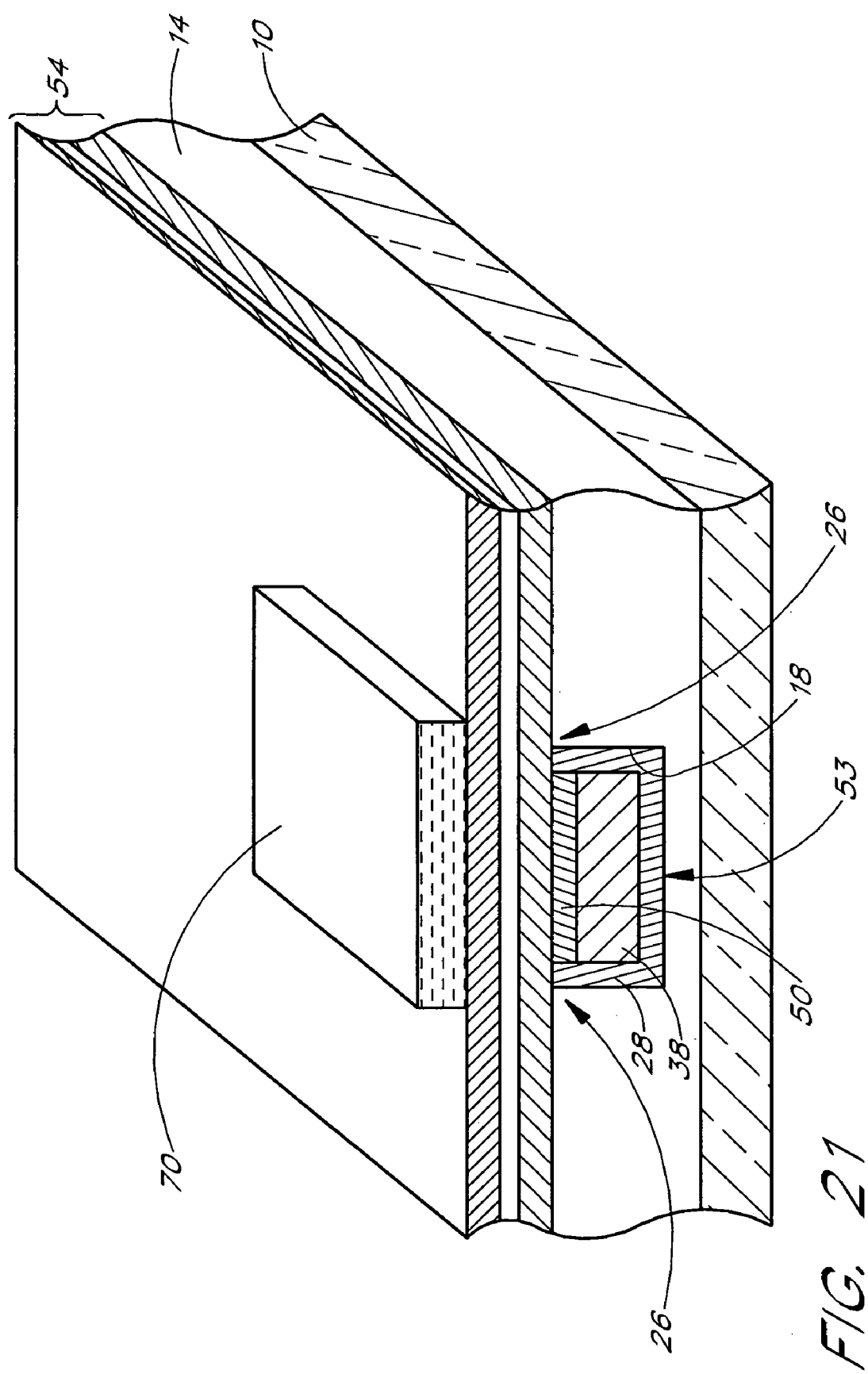

Additionally, in the exemplary diagram of FIG. 21, the mask 70 is illustrated with a width that extends beyond the width of the underlying electrode. In other words, the mask 70 overlaps the groove 18, with sidewalls of the mask 70 extending beyond the edge or lip 26 of the groove. However, it will be understood that the scope of the present invention encompasses alternative configurations, e.g., wherein the width of the mask 70 is less than that of the underlying electrode 53.

Figure 22:
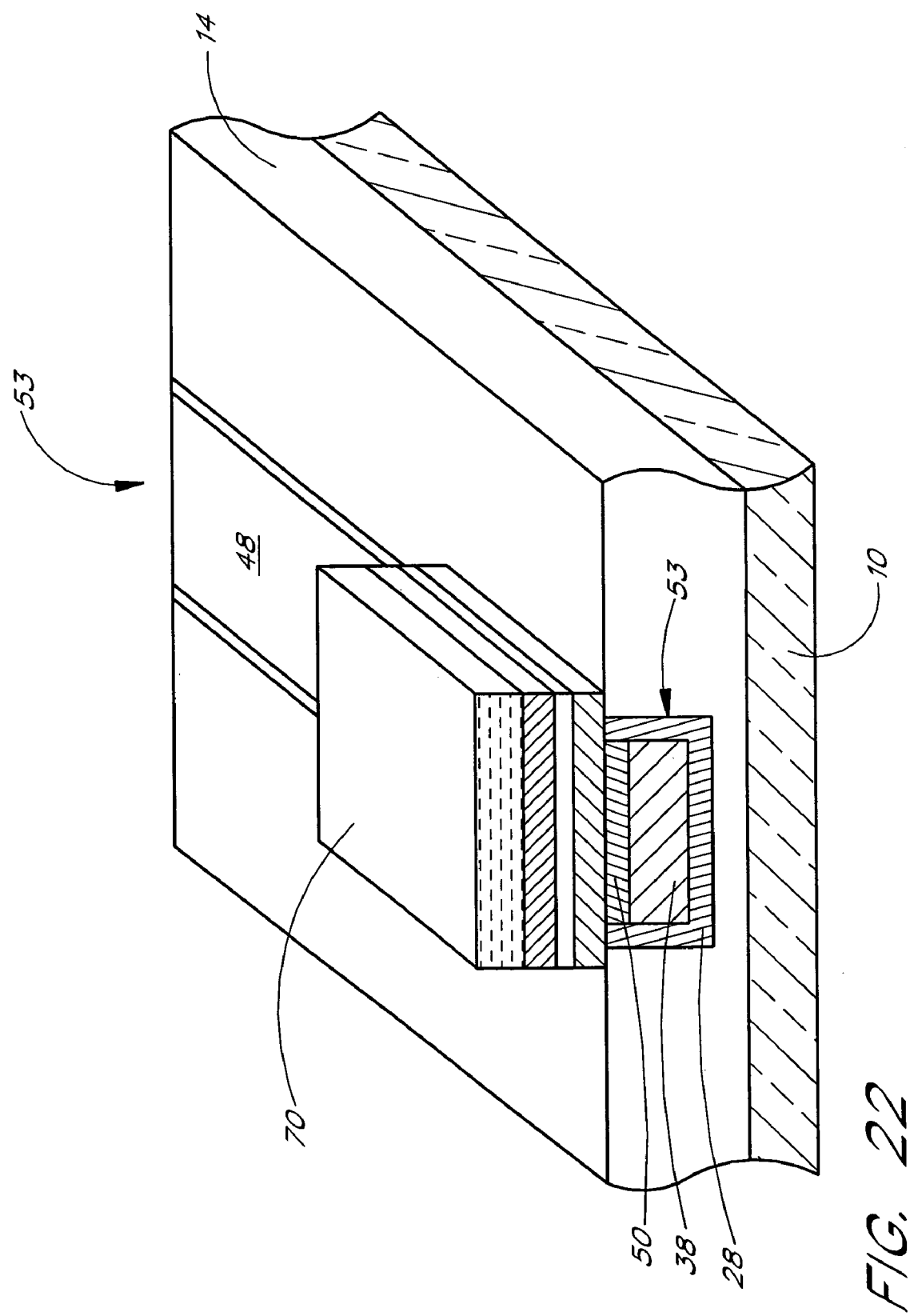

Continuing with further reference to FIG. 22, regions of the magneto-resistive material are etched for defining magneto-resistive stacks over the underlying electrode, which stack shapes are defined in accordance with the shape of the mask 70. The etching of the magneto-resistive material preferably stops upon reaching the upper surface 48 of the electrode 53. Preferably, the select regions of magneto-resistive material are removed using a known reactive ion plasma etchant of a chlorine-based chemistry. By selecting appropriate material, e.g., tantalum, for the protective cap 50 over electrically conductive wire 38, the chlorine-based chemistry can be used for etching the magneto-resistive materials while assuring that the cap 50 protects copper, for example, of the underlying electrically conductive wire 38.

As recognized by the inventor, chlorine is a preferred plasma chemistry for etching magneto-resistive materials. However, the chlorine-based plasma can damage copper of the underlying electrically conductive wire 38. Accordingly, exemplary embodiments of the present invention, as set forth herein, provide shapes and material for the cap 50 over the electrically conductive wire 38 for preserving the integrity of the electrically conductive wire 38, while at the same time, providing a flat surface over which the magneto-resistive materials can be formed.

Figure 23:
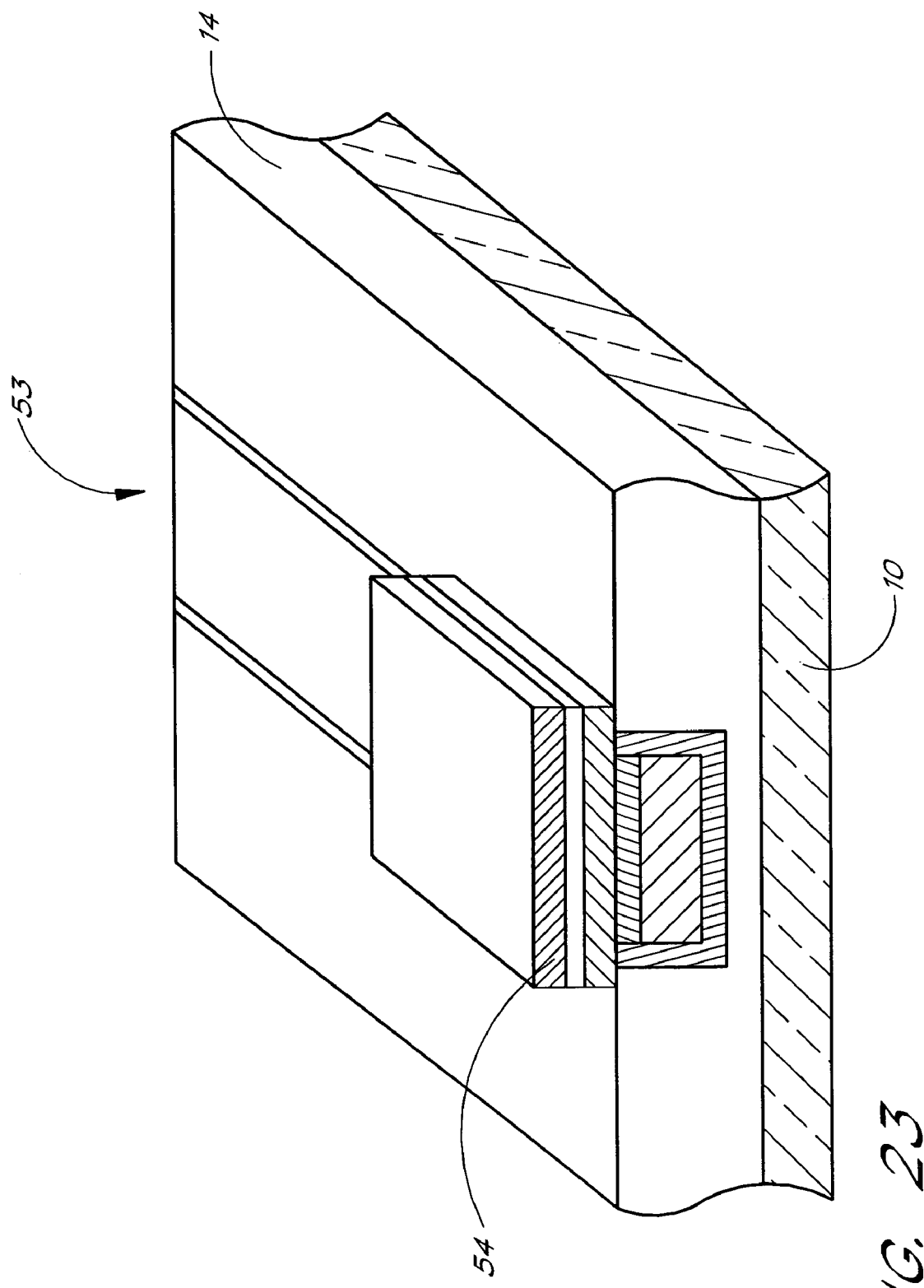

After patterning of the magneto-resistive material 54, the mask 70 is removed, leaving the magneto-resistive memory element stack 54 over at least a portion of the underlying electrode 53, as illustrated by the exemplary schematic diagram of FIG. 23.

Figure 24:
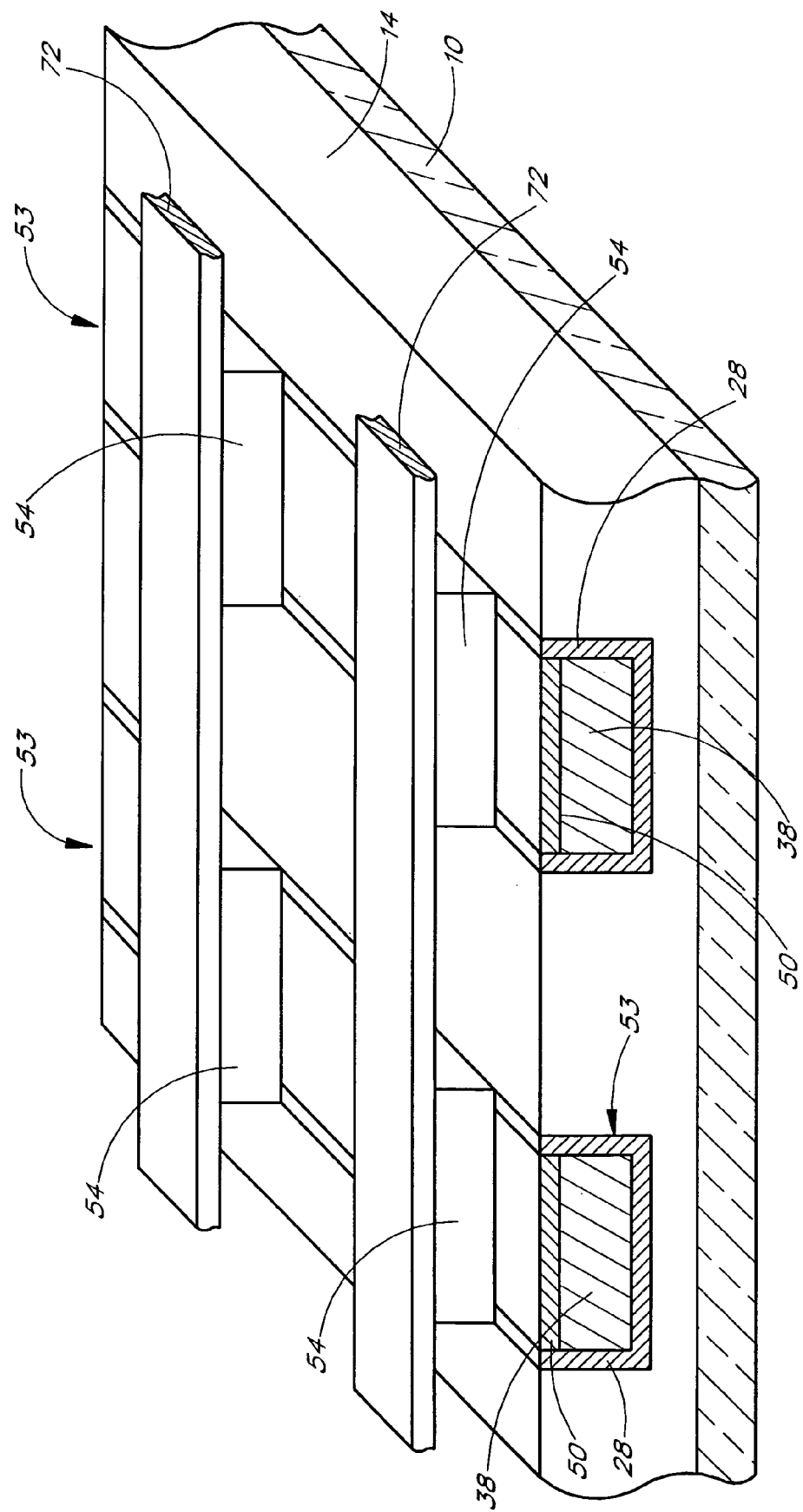
FIG. 24 is a partial perspective view schematically illustrating another step in the formation of a magneto-resistive memory element in accordance with exemplary embodiments of the present invention, wherein electrically conductive wires are formed over the top of magneto-resistive memory elements for an array of magnetic memory.

Continuing with further reference to FIG. 24, conductive wires 72 are formed, using known methods, over the tops of the patterned magneto-resistive memory elements 54. The wires 72 are formed with overlapping relationships to the underlying conductive wires 38, and may function as second electrodes for the magneto-resistive memory elements 54.

The gaps between wires 72, and over the layer of insulating material 14 can be filled with known dielectric material such as, e.g., TEOS or BPSG, or other low dielectric material (not shown). Silicon nitride can also be used to prevent diffusion from the magnetic materials in the stacks 54. In this fashion, an array of the electrodes 53 and 72 in combination with the magneto-resistive memory stacks 54 therebetween, form the basis of a cross-point array of magneto-resistive memory elements for a magnetic random access memory (MRAM).

Although the foregoing invention has been described with reference to certain exemplary embodiments, other embodiments will become apparent in view of this disclosure. Therefore, the described embodiments are to be considered only as illustrative and not restrictive. The scope of the present invention, therefore, is indicated by the appended claims and their combination in whole or in part rather than by the foregoing description. All changes thereto would come within the meaning and range of the equivalence of the claims are to be embraced within their scope.

I claim:

1. An electrode structure for a magnetic memory device, comprising:
    a layer of insulating material comprising walls that define a groove therein, sidewalls of the walls ending adjacent a surface of the layer of insulating material to define a lip of the groove;
    a liner disposed conformably within the groove;
    an electrically conductive wire disposed over the liner in the groove;
    a cap layer disposed in the groove and over the electrically conductive wire, wherein the cap layer extends over end walls of the liner; and
    a layer of magnetic material disposed over at least a portion of the cap layer.

2. The electrode according to claim 1, wherein the liner comprises a layer of electrically conductive material different from that of the electrically conductive wire.

3. The electrode according to claim 2, wherein the liner comprises a layer of tantalum.

4. The electrode according to claim 1, wherein the liner comprises a layer of electrically conductive material and a layer of ferromagnetic material.

5. The electrode structure according to claim 4, wherein the liner is defined at least in part by two layers of electrically conductive material sandwiching a layer of magnetic material.

6. The electrode structure according to claim 5, wherein at least a first portion of the liner comprises two layers of tantalum sandwiching a layer of ferromagnetic material.

7. The electrode structure according to claim 6, wherein the ferromagnetic material comprises NiFe.

8. The electrode structure according to claim 7, wherein the cap layer comprises Ta.

9. The electrode structure according to claim 1, wherein the liner serves as a diffusion barrier between the layer of insulating material and the electrically conductive wire.

10. The electrode structure according to claim 9, wherein the electrically conductive wire comprises copper.

11. The electrode structure according to claim 10, wherein the layer of insulating material comprises an oxide.

12. The electrode structure according to claim 10, wherein the liner comprises a layer of tantalum.

13. The electrode structure according to claim 12, wherein the cap layer comprises tantalum.

14. The electrode structure according to claim 1, wherein the cap layer comprises an electrically resistive material.

15. The electrode structure according to claim 14, wherein the cap layer comprises a material selected from the group consisting of TaN, TiAlN, WSiN, and TaSiN.

16. The electrode structure according to claim 14, wherein the cap layer comprises TiATN.

17. The electrode structure according to claim 1, wherein the liner includes at least one layer having substantially the same composition as the cap layer.

18. An apparatus for a magnetoresistive memory device comprising:
    a substrate;
    a layer of insulating material disposed over the substrate, the layer of insulating material comprising a distal surface that faces away from the substrate, and further comprising walls extending proximally toward the substrate and defining a groove within the layer of insulating material;
    a liner disposed conformably in contact with the walls of the groove, the liner comprising distal edges, wherein the liner comprises magnetically susceptible material;
    electrically conductive material disposed in the groove and over the liner;
    a protective layer disposed in the groove and over the conductive material, the protective layer comprising an outer surface that faces away from the conductive material, the outer surface substantially level with the distal surface of the insulating material; and
    at least one layer of magnetoresistive material disposed over at least a portion of the protective layer.

19. The apparatus according to claim 18, wherein the electrically conductive material comprises copper.

20. The apparatus according to claim 18, wherein the liner comprises:
    a first layer of electrically-conductive material disposed conformably over, and in contact with, at least a portion of the walls of the insulating material that define the groove;
    wherein the magnetically susceptible material is disposed conformably over the first layer of electrically-conductive material; and
    a second layer of electrically-conductive material disposed conformably over the magnetically susceptible material.

21. The apparatus according to claim 20, wherein the protective layer comprises electrically-conductive material.

22. The apparatus according to claim 21, wherein the protective layer comprises tantalum.

23. The apparatus according to claim 22, wherein the at least one layer of magnetoresistive material comprises a tunneling magnetoresistive stack.

24. A magnetoresistive random access memory (MRAM) device having at least one magnetic memory cell comprising:
    a substrate;
    a layer of insulating material disposed over the substrate, walls of the layer of insulating material defining a groove, the layer of insulating material further comprising an outer surface that faces away from the substrate;

a first electrically conductive material disposed within the groove;

a liner disposed between walls of the groove and the first electrically conductive material;

a protective layer comprising second electrically conductive material disposed in the groove and over the first electrically conductive material and over end walls of the liner, the protective layer comprising a first surface in contact with the first electrically conductive material and the end walls of the liner and a second surface opposite the first surface, the second surface level with a plane defined by the outer surface of the layer of insulating material; and at least one layer of magnetoresistive material disposed over at least a portion of the protective layer.

25. The MRAM device according to claim 24, wherein the first electrically conductive material comprises copper.

26. The MRAM device according to claim 25, wherein the liner comprises a layer of tantalum.

27. A magnetoresistive random access memory (MRAM) device having at least one magnetic memory cell comprising:

a substrate;

a layer of insulating material disposed over the substrate, the layer of insulating material comprising an outer surface that faces away from the substrate, the layer of insulating material further comprising walls that define a groove, side-walls of the groove meeting the outer surface of the layer of insulating material to define edges or lips;

a copper line disposed within the groove;

a liner disposed between walls of the groove and the copper line;

a protective layer disposed in the groove and over the copper line, the protective layer comprising a first surface in contact with the copper line and a second surface opposite the first surface; and at least one layer of magnetoresistive material disposed over at least a portion of the protective layer;

wherein the protective layer extends wider in at least two directions than the at least one layer of magnetoresistive material.

28. The MRAM device according to claim 27, wherein the layer of insulating material comprises oxide.

29. The MRAM device according to claim 28, wherein the protective layer comprises tantalum.

30. The MRAM device according to claim 27, wherein the liner comprises substantially the same material forming the protective layer.

31. The MRAM device according to claim 27, wherein the protective layer comprises an electrically resistive material.

32. The MRAM device according to claim 27, wherein the liner extends upwardly adjacent sidewall edges of the protective layer.

33. The MRAM device according to claim 27, wherein the protective layer extends over end walls of the liner.

34. The MRAM device according to claim 27, wherein the liner comprises magnetically susceptible material.

35. The MRAM device according to claim 27, wherein the protective layer extends over end walls of the liner and the liner comprises magnetically susceptible material.

36. The apparatus according to claim 18, wherein the protective layer extends over end walls of the liner.

37. The MRAM device according to claim 24, wherein the liner comprises magnetically susceptible material.

* * * * *